United States Patent
Sakamoto et al.

(10) Patent No.: US 9,741,775 B2
(45) Date of Patent: Aug. 22, 2017

(54) DISPLAY DEVICE

(71) Applicant: Japan Display Inc., Tokyo (JP)

(72) Inventors: Shigeru Sakamoto, Tokyo (JP);
Masakazu Gunji, Tokyo (JP);
Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/139,426

(22) Filed: Apr. 27, 2016

(65) Prior Publication Data

US 2016/0322437 A1 Nov. 3, 2016

(30) Foreign Application Priority Data

Apr. 30, 2015 (JP) .................................. 2015-092927

(51) Int. Cl.
*H01L 27/32* (2006.01)
*H01L 51/52* (2006.01)

(52) U.S. Cl.
CPC ...... *H01L 27/3246* (2013.01); *H01L 51/5209* (2013.01)

(58) Field of Classification Search
CPC .................. H01L 27/3246; H01L 51/5209
See application file for complete search history.

(56) References Cited

U.S. PATENT DOCUMENTS

| | | | |
|---|---|---|---|
| 2001/0019133 A1 | 9/2001 | Konuma et al. | |
| 2002/0047567 A1* | 4/2002 | Fujita | H01L 27/3248 315/169.3 |
| 2005/0029522 A1 | 2/2005 | Konuma et al. | |
| 2007/0051959 A1 | 3/2007 | Konuma et al. | |
| 2010/0200871 A1 | 8/2010 | Konuma et al. | |
| 2012/0199853 A1 | 8/2012 | Konuma et al. | |
| 2014/0252337 A1 | 9/2014 | Konuma et al. | |
| 2014/0295597 A1* | 10/2014 | Sato | H01L 51/5262 438/29 |
| 2015/0035100 A1* | 2/2015 | Tanida | H01L 27/14623 257/432 |

FOREIGN PATENT DOCUMENTS

| | | |
|---|---|---|
| JP | 2001-312223 A | 11/2001 |
| JP | 2005-197027 A | 7/2005 |

* cited by examiner

*Primary Examiner* — Caleb Henry
*Assistant Examiner* — Mounir Amer
(74) *Attorney, Agent, or Firm* — Typha IP LLC (57) ABSTRACT

A display device includes a plurality of pixels on a substrate including an insulating surface. Each of the plurality of pixels includes: a transistor above the insulating surface; a planarization film covering the transistor; a pixel electrode above the planarization film and electrically connected with the transistor; an insulating layer filled in a recess located around the pixel electrode between the pixels adjacent to each other; a light-emitting layer covering a surface of the pixel electrode and at least a part of a surface of the insulating layer; and a counter electrode above the light-emitting layer. A distance between a surface of the substrate and a face of the light-emitting layer in contact with the insulating layer is equal to or smaller than a distance between the surface of the substrate and a face of the light-emitting layer in contact with the pixel electrode.

18 Claims, 6 Drawing Sheets

DISPLAY DEVICE

CROSS-REFERENCE TO RELATED APPLICATION

The present application claims priority from Japanese application JP2015-092927 filed on Apr. 30, 2015, the content of which is hereby incorporated by reference into this application.

BACKGROUND OF THE INVENTION

1. Field of the Invention

The present invention relates to a display device.

2. Description of the Related Art

In recent years, display devices using a self-luminous object such as an organic light-emitting diode (OLED) have been put to practical use. Since the self-luminous object is used, the display devices including an organic electro-luminescent (EL) display device using the OLED are superior in terms of visibility and response speed compared with a related-art liquid crystal display device, and in addition, a further reduction in thickness is possible because an auxiliary lighting device such as a backlight is not necessary.

JP 2005-197027 A discloses an organic EL device in which a pixel electrode and an organic EL layer are provided in an opening of a bank. The pixel electrode is connected with a drain electrode at the bottom of a contact hole provided below the opening of the bank in an inter-layer insulating layer. JP 2001-312223 A discloses that in a contact hole in which drain wiring of a thin film transistor and a pixel electrode are connected, a protective portion is formed on the pixel electrode in the contact hole for preventing a short circuit between the pixel electrode and a cathode.

A light-emitting region of a self-emitting element such as an organic EL is surrounded by a raised bank. Because of the presence of this bank, it is difficult to shorten a distance between the light-emitting region and a planar object disposed above the light-emitting region and constituting a display device. Therefore, for example, when a color filter is disposed above the light-emitting region, color mixture occurs in which light emitted as a blue pixel leaks to a color filter of a red pixel.

SUMMARY OF THE INVENTION

The invention has been made in view of the problem described above, and it is an object of the invention to provide a technique capable of shortening a distance between a light-emitting region of a self-emitting element and an object disposed above the light-emitting region.

A typical outline of the invention disclosed in the application will be described below.

A display device according to the present invention includes a plurality of pixels on a substrate including an insulating surface. Each of the plurality of pixels includes: a transistor above the insulating surface; a planarization film covering the transistor; a pixel electrode above the planarization film and electrically connected with the transistor; an insulating layer in a recess located around the pixel electrode between the pixels adjacent to each other; a light-emitting layer covering a surface of the pixel electrode and at least a part of a surface of the insulating layer; and a counter electrode above the light-emitting layer. A distance between a surface of the substrate and a face of the light-emitting layer in contact with the insulating layer is equal to or smaller than a distance between the surface of the substrate and a face of the light-emitting layer in contact with the pixel electrode.

According to the present invention, it is possible to further shorten the distance between the light-emitting region of the self-emitting element and the object disposed above the light-emitting region.

DETAILED DESCRIPTION OF THE INVENTION

In the following, embodiments of the invention will be described based on the drawings. In components appearing herein, components having the same functions are denoted by the same reference characters, and the description thereof is omitted. Moreover, in aspects shown in the drawings, the width, thickness, shape, and the like of each part may be schematically represented in order to facilitate a description, compared with those in practicing aspects. However, they are illustrative only, and do not limit the interpretation of the invention. In the following, an organic electro-luminescence (EL) display device using an organic light-emitting diode (OLED) as one kind of self-emitting element will be described.

[First Embodiment]

Figure 1:
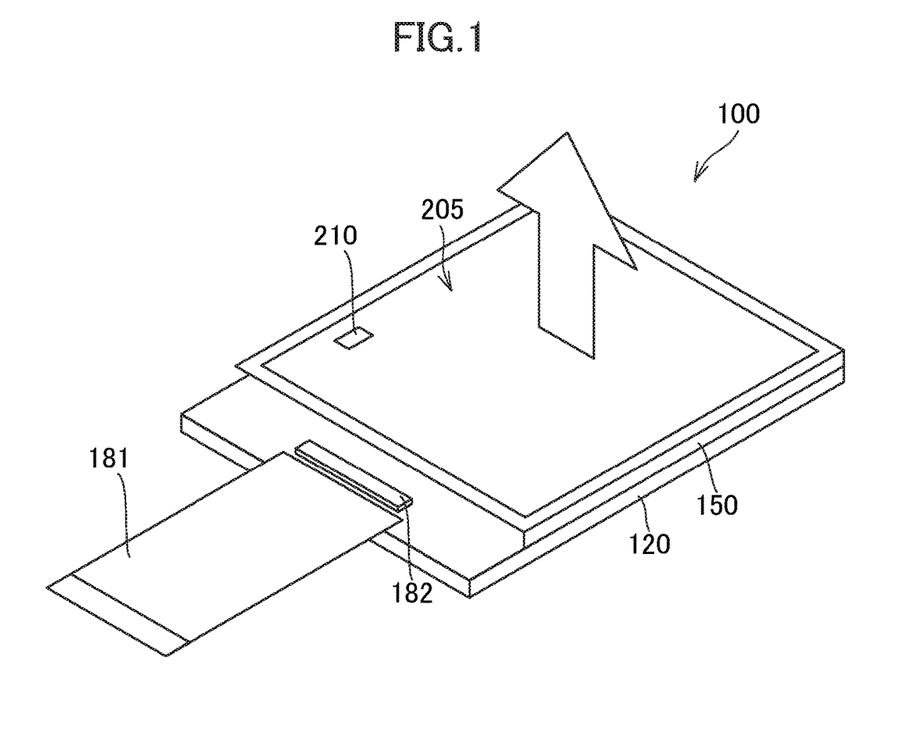
FIG. 1 is a perspective view schematically illustrating an example of an organic EL display device according to a first embodiment.

FIG. 1 is a perspective view schematically illustrating an example of an organic EL display device 100 according to a first embodiment of the invention. As shown in FIG. 1, the organic EL display device 100 includes two substrates, an array substrate 120 and a counter substrate 150. The counter substrate 150 faces the array substrate 120. In the array substrate 120 and the counter substrate 150 of the organic EL display device 100, a display region 205 composed of pixels 210 disposed in a matrix is formed. Here, the pixels 210 are arranged in x columns and y rows in the display region 205. Each of the pixels 210 outputs any color of three colors or four colors, and is also called a sub-pixel. For example, one dot included in an image to be displayed is expressed by a plurality of sub-pixels adjacent to each other and different in color. In the following, the case of a stripe arrangement in which a red sub-pixel, a blue sub-pixel, and a green sub-pixel that constitute one dot are arranged in one direction will be described. In this case, the sub-pixel is rectangular. Moreover, one dot may be composed of four square sub-pixels (red, green, blue, and white), and the four sub-pixels may be arranged in a 2×2 square shape.

Moreover, the array substrate 120 is a substrate made of, for example, glass or resin, and includes an insulating surface. Pixel circuits are disposed in a matrix on the array substrate 120. Each of the pixel circuits corresponds to the pixel 210, and includes a thin film transistor (TFT). A driver integrated circuit 182 and a flexible printed board (flexible printed circuits) 181 for receiving an image signal or the like from the outside are attached to the array substrate 120. The driver integrated circuit 182 outputs, to a pixel transistor included in each of the pixel circuits, a scanning signal for establishing electrical continuity between the source and drain of the pixel circuit. Also, the driver integrated circuit 182 is provided with a driver circuit that outputs a signal in response to a display tone of the pixel 210 to the sub-pixel thereof. Moreover, as shown by the arrow in the drawing, the organic EL display device 100 according to the embodiment is a top-emission-type organic EL display device that emits light to the side of the array substrate 120 where a light-emitting layer is formed.

Figure 2:
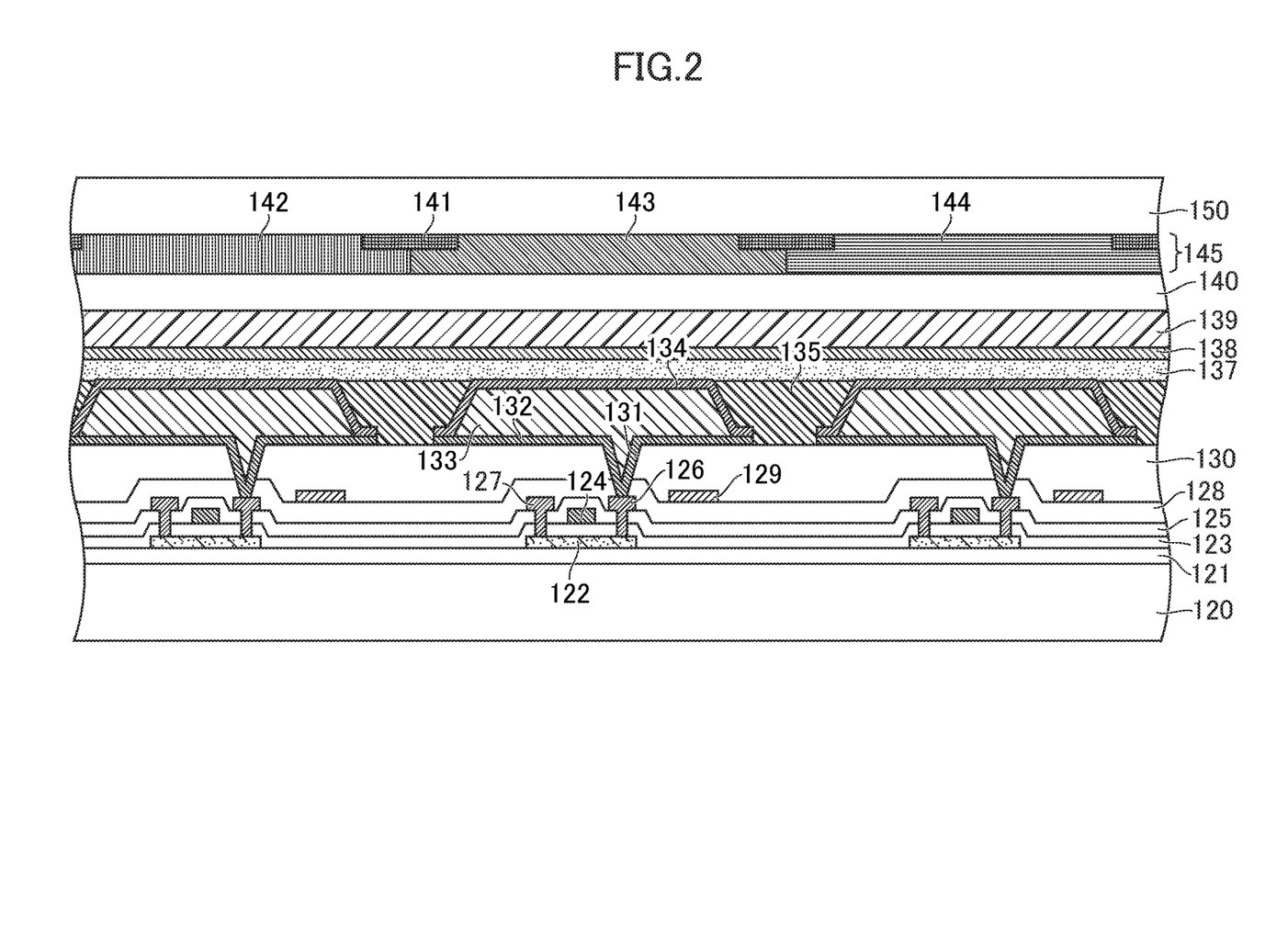
FIG. 2 is a partial cross-sectional view illustrating an example of the configuration of a pixel according to the first embodiment.

FIG. 2 is a partial cross-sectional view illustrating an example of the configuration of the pixel 210 according to the first embodiment. An undercoating layer 121, a semiconductor layer including a semiconductor film 122, an inter-layer insulating layer 123, a first electrode layer including gate electrodes 124, an inter-layer insulating layer 125, a second electrode layer including source electrodes and drain electrodes 126 and 127, an inter-layer insulating layer 128, an electrode layer including wiring 129, a planarization film 130 in which contact holes 131 are formed, a third electrode layer including extraction electrodes 132, a bank layer including inside banks 133, a fourth electrode layer including pixel electrodes 134, an outer insulating layer 135, an organic EL layer 137, a common electrode 138, and a sealing film 139 are sequentially stacked on the array substrate 120. The undercoating layer 121 and the inter-layer insulating layers 123, 125, and 128 are insulating layers containing, for example, silicon oxide or silicon nitride. Moreover, the electrode layers from the first electrode layer to the third electrode layer are particularly required to be of low resistance, and are composed of a metal layer selected from molybdenum (Mo), titanium (Ti), aluminum (Al), and the like, or stacked layers of these metals. The fourth electrode layer is determined in view of a work function and the like for driving the organic EL layer 137, and is composed of an oxide conductive material or the like selected from indium tin oxide (ITO), indium zinc oxide (IZO), zinc oxide (ZnO), and the like. Moreover, the fourth electrode layer is required to be reflective in the case of the top emission type, and may include a layer of silver (Ag), Al, or the like as a reflective layer.

Layers of a color filter 145 and a black matrix 141 are formed on a face of the counter substrate 150 on the array substrate 120 side. The color filter 145 transmits lights of, for example, three colors or four colors in different wavelength ranges. In the example of FIG. 2, the color filter 145 includes a red region 142 that transmits red light, a green region 143 that transmits green light, and a blue region 144 that transmits blue light. The black matrix 141 is a light-shielding film that blocks light leaking through the boundary between the sub-pixels. A filling material 140 is provided between the color filter 145 formed on the counter substrate 150 and the sealing film 139 stacked on the array substrate 120. The array substrate 120 on which the layers up to the sealing film 139 are stacked and the counter substrate 150 on which the color filter 145 is formed are bonded together using the filling material 140 interposed between the sealing film 139 and the color filter 145 as a bonding material. In FIG. 2, the organic EL layer 137 is configured such that the organic EL layer 137 is uniformly provided over the plurality of sub-pixels and respective colors are expressed by the color filter 145; however, the organic EL layer 137 is not limited to this configuration, and organic EL layers 137 that present light emission of respective colors may be individually formed so as to cover the surfaces of the pixel electrodes 134 included in the sub-pixels. In this case, since the organic EL layers 137 themselves emit the lights of the respective colors, the color filter 145 becomes unnecessary on the counter substrate 150 side.

The plurality of pixel circuits respectively corresponding to the plurality of pixels 210 and disposed in a matrix are provided on the array substrate 120. A portion of the pixel circuit except for an organic EL element is formed in the layers from the undercoating layer 121 to the wiring 129. Moreover, the semiconductor film 122, the gate electrode 124, the drain electrode 126, and the source electrode 127 constitute a thin film transistor directly connected to the organic EL element. This thin film transistor controls the light emission of the pixel 210 corresponding to the pixel circuit including this thin film transistor. As viewed planarly, the semiconductor film. 122 and the gate electrode 124 overlap each other, and the semiconductor film 122 extends so as to project from the gate electrode 124 with respect to the horizontal direction of the gate electrode 124 in FIG. 2. A region of the semiconductor film 122 overlapping the gate electrode 124 serves as a channel region of the thin film transistor, and the upper surfaces of the projecting portions of the semiconductor film 122 are respectively in contact with the source electrode and the drain electrode 126 and 127 penetrating the inter-layer insulating layers 123 and 125. The planarization film 130 is, for example, an acrylic resin film, and is provided so as to cover mainly the portion of the pixel circuit including the thin film transistor except for the organic EL element.

Moreover, the contact hole 131 is formed above the source electrode or drain electrode 126 in the inter-layer insulating layer 128 and the planarization film 130, and the source electrode or drain electrode 126 and the extraction electrode 132 are in contact with each other at the bottom of this contact hole 131. The inside bank 133 made of, for example, acrylic resin is provided on the extraction electrode 132. The cross-section of the inside ban k 133 shown in FIG. 2 is trapezoidal, and the inside bank 133 includes an upper surface, a lower surface, and a side surface that is inclined so as to spread from the upper surface toward the lower surface. The lower surface of the inside bank 133 is in contact with the extraction electrode 132, and the upper surface and the side surface are covered by the pixel electrode 134. The pixel electrode 134 does not necessarily cover the entire upper and side surfaces of the inside bank 133. The pixel electrode 134 may cover at least a portion of the upper and side surfaces of the inside bank 133.

As viewed planarly, the inside bank 133 is located inside the extraction electrode 132 and the pixel electrode 134, and the extraction electrode 132 and the pixel electrode 134 are electrically connected around the inside bank 133. The organic EL layer 137 is provided on the pixel electrode 134; the layer of the common electrode 138 composed of, for example, a transparent electrode is provided on the organic EL layer 137; and further, the common electrode 138 is covered by the sealing film 139. The pixel electrode 134, the extraction electrode 132, the organic EL layer 137, and the common electrode 138 constitute an OLED in which the pixel electrode 134 and the extraction electrode 132 are an anode and the common electrode 138 is a cathode. The organic EL layer 137 is a light-emitting layer that emits light when a voltage is applied by the pixel electrode 134 and the common electrode 138 and a current flows through the organic EL layer 137. As viewed planarly, the light-emitting region of a certain pixel 210 is separated from the light-emitting region of another pixel 210; and in the pixel 210, the shape of a region where the pixel electrode 134 and the organic EL layer 137 are in contact with each other corresponds to the shape of the light-emitting region of the pixel 210. Moreover, the region where the pixel electrode 134 and the organic EL layer 137 are in contact with each other is disposed directly above the thin film transistor, more strictly speaking, directly above the contact hole 131 in which the source electrode or drain electrode 126 and the extraction electrode 132 are connected to each other.

A recess formed by the inside bank 133 and the pixel electrode 134 is present in a region located between the pixels 210 adjacent to each other as viewed planarly, more specifically, in a region around the pixel electrode 134. A resin (for example, acrylic resin) that constitutes the outer insulating layer 135 is filled in this recess. As viewed planarly, the outer insulating layer 135 is not formed in the light-emitting region.

Here, with respect to the region of the lower surface of the organic EL layer 137, there is no region exceeding the height of a region where the organic EL layer 137 and the pixel electrode 134 face each other. Moreover, in the region of the lower surface of the organic EL layer 137, the region where the organic EL layer 137 and the pixel electrode 134 are in contact with each other is located at the highest position, while the other regions are located at positions at the same height as, or lower than the region. When viewed in another perspective, the height of the upper surface of the outer insulating layer 135 does not exceed the height of the upper surface of the pixel electrode 134. In the example of FIG. 2, the height of the upper surface of the outer insulating layer 135 is aligned with the height of the upper surface of the pixel electrode 134, and the upper and lower surfaces of the organic EL layer 137 are flat. A step located in the recess is filled with the outer insulating layer 135; the occurrence of a phenomenon (disconnection) in which the organic EL layer 137 or the common electrode 138 is disconnected by the step is suppressed; and it is possible to suppress the occurrence of a defective piece. Here, the term "height" indicates a distance from the substrate 120 side to the direction of stacking of the structures, that is, a distance toward the upper side in FIG. 2.

Figure 3:
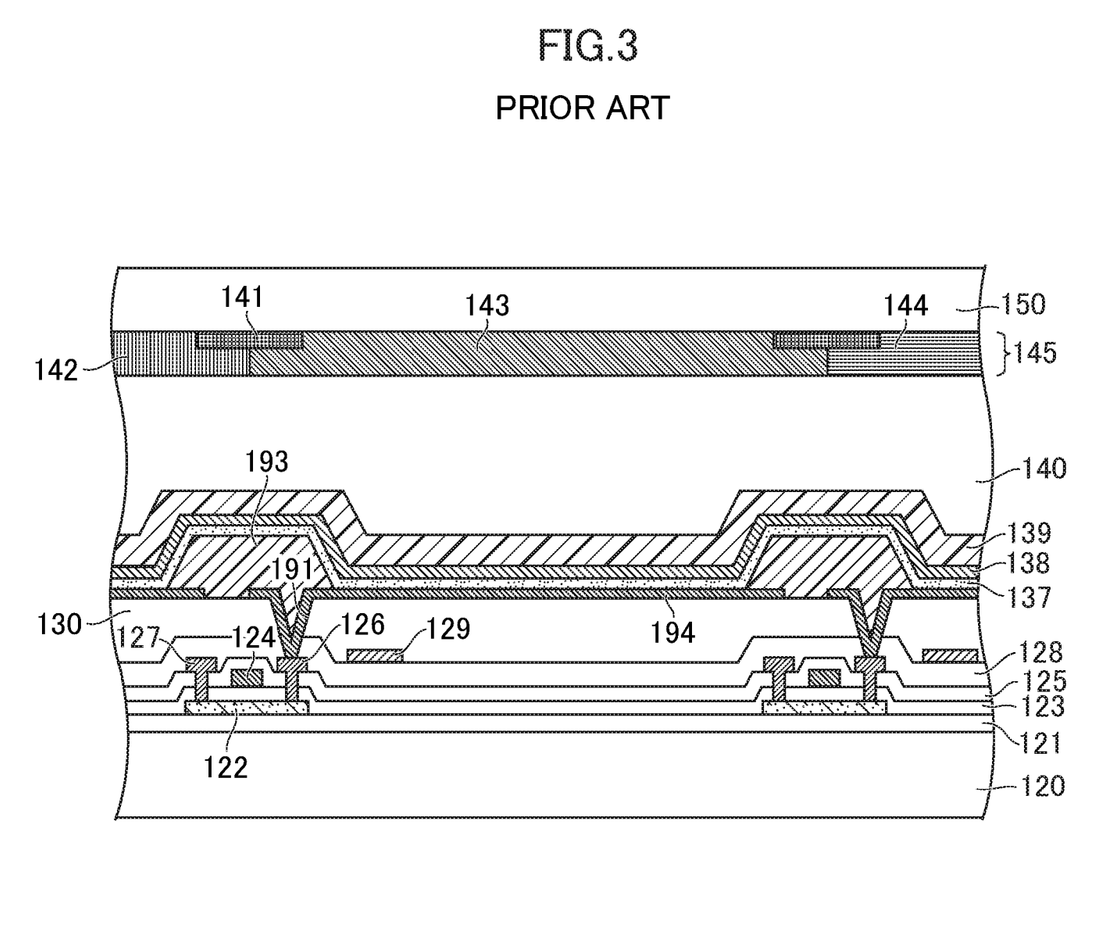
FIG. 3 is a partial cross-sectional view illustrating an example of the configuration of a related-art pixel.

FIG. 3 is a partial cross-sectional view illustrating an example of the configuration of a related-art pixel. In the example shown in FIG. 3, a pixel electrode 194 is in contact with the source electrode or drain electrode 126 at the bottom of a contact hole 191, and a bank 193 is provided directly above a thin film transistor. The pixel electrode 194 and the organic EL layer 137 are in contact with each other in a region where the bank 193 is absent as viewed planarly, and a light-emitting region is present in a recess surrounded by the bank 193. For this reason, a distance between the light-emitting region and the color filter 145 above the light-emitting region is larger than the distance according to the embodiment. The color filter 145 is present in the example of FIG. 3; light from the light-emitting region is more likely to leak to the region of the color filter 145 for the adjacent pixel than in the embodiment; and color mixture due to the mixture of color of the adjacent pixel is likely to occur.

On the other hand, the light-emitting region is close to the color filter 145 located above the light-emitting region in the embodiment, and thus the color mixture is less likely to occur. Moreover, since a region directly above the thin film transistor is also used as the light-emitting region in the embodiment, the layout of the light-emitting region is easily designed. Since the occurrence of the color mixture is suppressed and the layout is easily designed, it is possible to widen the light-emitting region or increase the area of the opening of the color filter 145.

Here, the outer insulating layer 135 may be a light-shielding film including a light-absorbing substance like the black matrix 141. In this case, a part of the light that propagates toward the adjacent pixel 210 is absorbed by the outer insulating layer 135 including a light-absorbing substance, and therefore, the occurrence of color mixture can be further suppressed.

[Second Embodiment]

Figure 4:
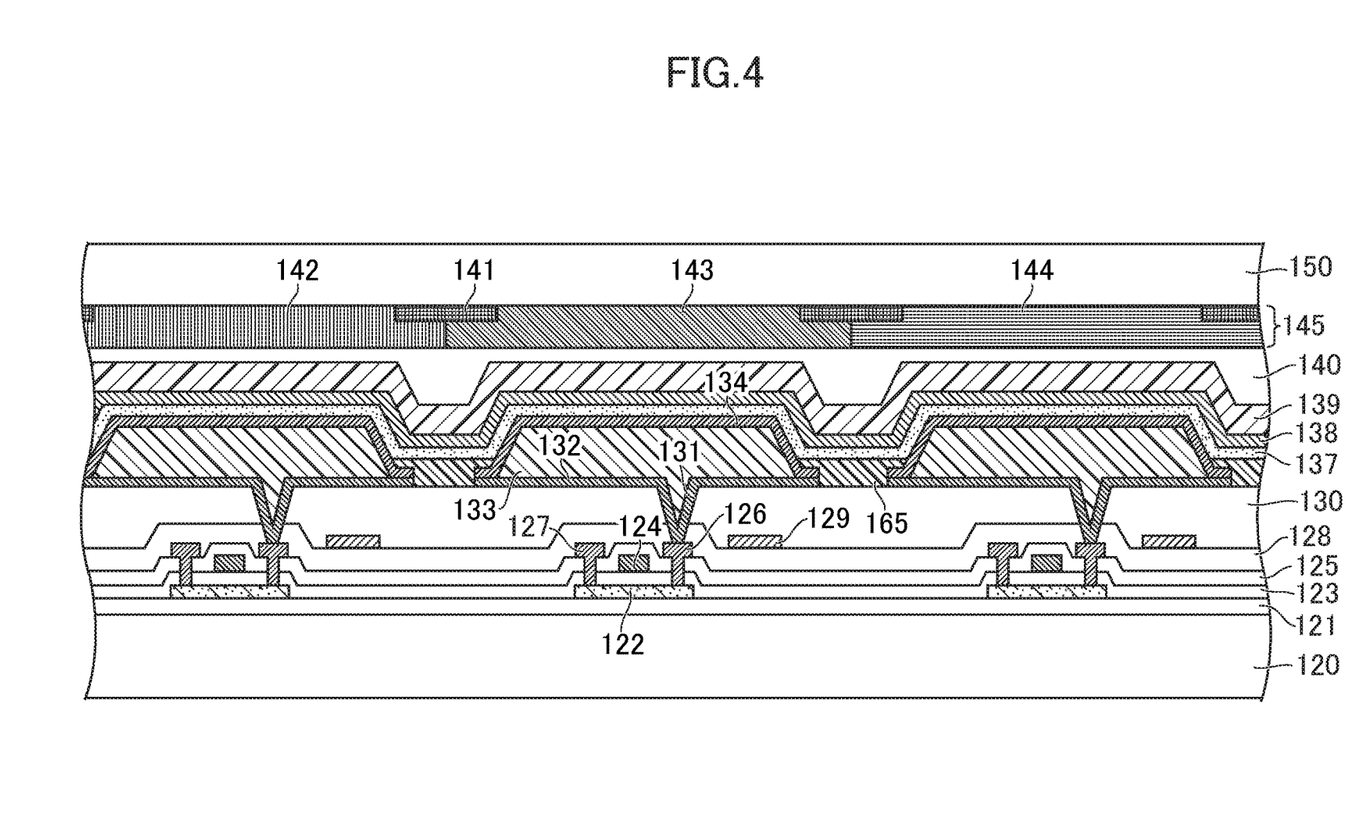
FIG. 4 is a partial cross-sectional view illustrating an example of the configuration of a pixel according to a second embodiment.

An organic EL display device according to a second embodiment is different from the first embodiment mainly in the structure of an outer insulating layer 165. The difference between the second embodiment and the first embodiment will be mainly described below.

FIG. 4 is a partial cross-sectional view illustrating an example of the configuration of the pixel 210 according to the second embodiment. In the organic EL display device according to the embodiment, the structures of the thin film transistor, the extraction electrode 132, the inside bank 133, and the pixel electrode 134 are similar to those of the example of FIG. 2 in the first embodiment, in which the extraction electrode 132, the inside bank 133, and the pixel electrode 134 are located directly above the thin film transistor. A recess formed by the inside bank 133 and the pixel electrode 134 is present in a region located between the pixels 210 adjacent to each other as viewed planarly. A resin that constitutes the outer insulating layer 165 is filled in this recess. The height of the upper surface of the outer insulating layer 165 is lower than the height of the upper surface of the pixel electrode 134. In the upper surface of the organic EL layer 137, a region above the outer insulating layer 165 is depressed. With respect to the lower surface of the organic EL layer 137, other regions than a region where the pixel electrode 134 and the organic EL layer 137 are in contact with and face each other are lower than the region.

Moreover, a region of the side surface of the pixel electrode 134 higher than the upper surface of the outer insulating layer 165 and the upper surface of the pixel electrode 134 are in contact with the organic EL layer 137. Hence, a region of the organic EL layer 137 in contact with the side surface also emits light, and thus the light-emitting region is wider than that of the example of FIG. 2. Moreover, in the embodiment, a depression is present in the organic EL layer 137, the common electrode 138, and the sealing film 139 between the inside banks 133 adjacent to each other. The filling material 140 is filled on the depression of the sealing film 139. It is possible to suppress the occurrence of a phenomenon in which air bubbles enter when the array substrate 120 and the counter substrate 150 are bonded together using the filling material 140 due to the irregularities of the sealing film 139.

[Third Embodiment]

Figure 5:
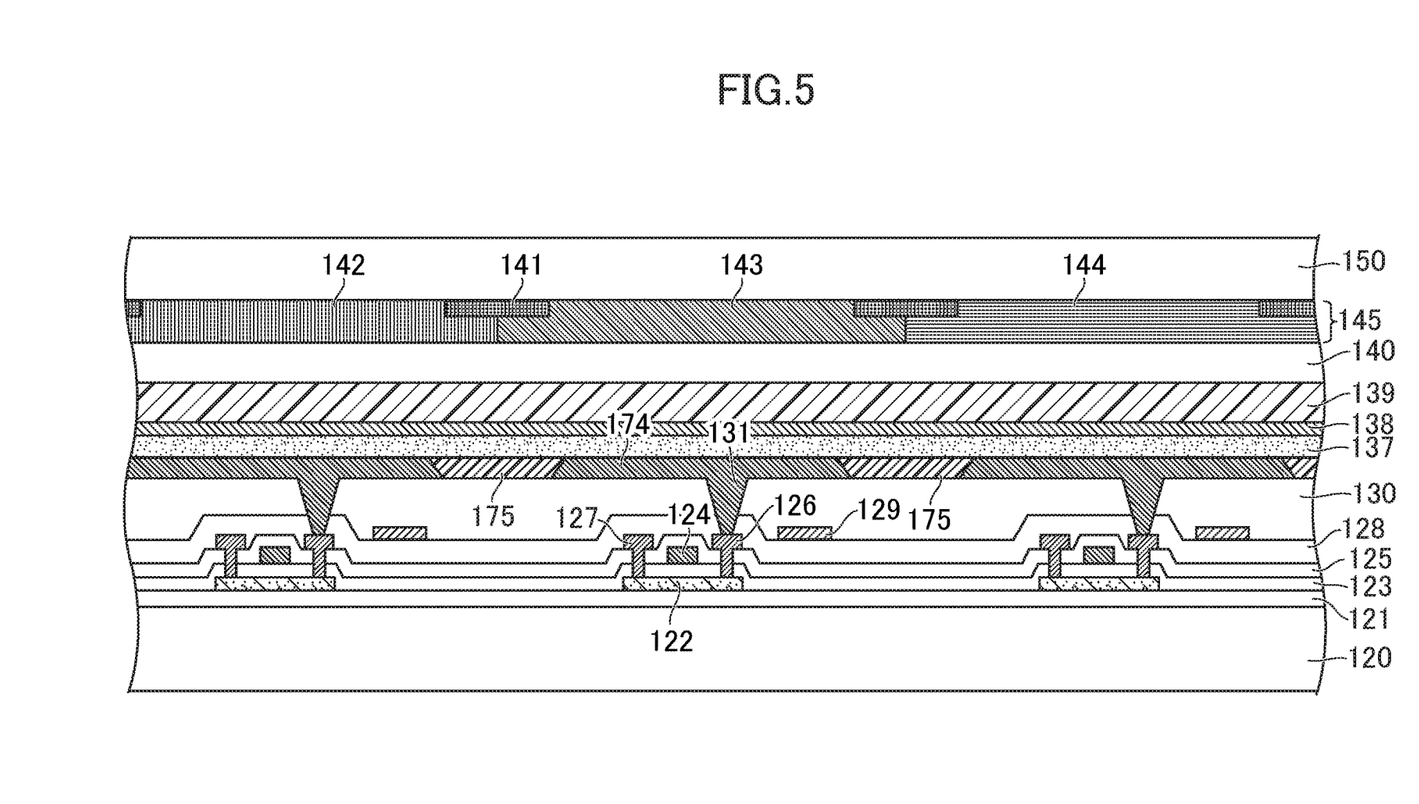
FIG. 5 is a partial cross-sectional view illustrating an example of the configuration of a pixel according to a third embodiment.

An organic EL display device according to a third embodiment does not include the inside bank 133 and the extraction electrode 132 in the first embodiment, and realizes its shape only with pixel electrodes 174. The difference between the third embodiment and the first embodiment will be mainly described below.

FIG. 5 is a partial cross-sectional view illustrating an example of the configuration of the pixel 210 according to the third embodiment. In the organic EL display device according to the embodiment, the structures from the array substrate 120 to the planarization film 130 and the structures of the counter substrate 150, the color filter 145, and the like are similar to those of the first embodiment. On the other hand, the pixel electrode 174 according to the embodiment contains a conductive material such as a conductive paste, a conductive ink, or a conductive polymer, and the film thickness of the pixel electrode 174 is larger than those of the first, second, third, and fourth electrode layers.

The contact hole 131 is formed above the drain electrode 126 in the inter-layer insulating layer 128 and the planarization film 130, and the source electrode or drain electrode 126 and the pixel electrode 174 are in contact with each other at the bottom of this contact hole 131. Moreover, the pixel electrode 174 includes an upper surface, a lower surface, and a side surface that is inclined so as to spread from the upper surface toward the lower surface. In the embodiment, the pixel electrode 174, the organic EL layer 137, and the common electrode 138 constitute an OLED in which the pixel electrode 174 is an anode and the common electrode 138 is a cathode. A region where the pixel electrode 174 and the organic EL layer 137 are in contact with each other is disposed directly above the thin film transistor, more strictly speaking, directly above the contact hole 131 in which the source electrode or drain electrode 126 and the pixel electrode 174 are connected to each other. Moreover, the organic EL layer 137 emits light in a light-emitting region corresponding to the region where the pixel electrode 174 and the organic EL layer 137 are in contact with each other.

A recess formed by the pixel electrode 174 is present in a region located between the pixels 210 adjacent to each other as viewed planarly, more specifically, in a region around the pixel electrode 174. A resin (for example, acrylic resin) that constitutes an outer insulating layer 175 is filled in this recess. As viewed planarly, the outer insulating layer 175 is not formed in the light-emitting region.

In the example of FIG. 5, with respect to the region of the lower surface of the organic EL layer 137, there is no region exceeding the height of a region where the organic EL layer 137 and the pixel electrode 174 face each other. Moreover, in the region of the lower surface of the organic EL layer 137, a region where the organic EL layer 137 and the pixel electrode 174 are in contact with each other is located at the highest position, while the other regions are located at positions at the same height as, or lower than the region. Moreover, the height of the upper surface of the outer insulating layer 175 does not exceed the height of the upper surface of the pixel electrode 174. In the example of FIG. 5, the height of the upper surface of the outer insulating layer 175 is aligned with the height of the upper surface of the pixel electrode 174, and the upper and lower surfaces of the organic EL layer 137 in contact with the upper surfaces of the outer insulating layer 175 and the pixel electrode 174 are flat. Here, the height of the upper surface of the outer insulating layer 175 may be lower than the height of the upper surface of the pixel electrode 174.

In the organic EL display device according to the embodiment, the process of forming the inside bank 133 or the extraction electrode 132 becomes unnecessary. For this reason, steps necessary for manufacture can be more simplified.

[Fourth Embodiment]

Figure 6:
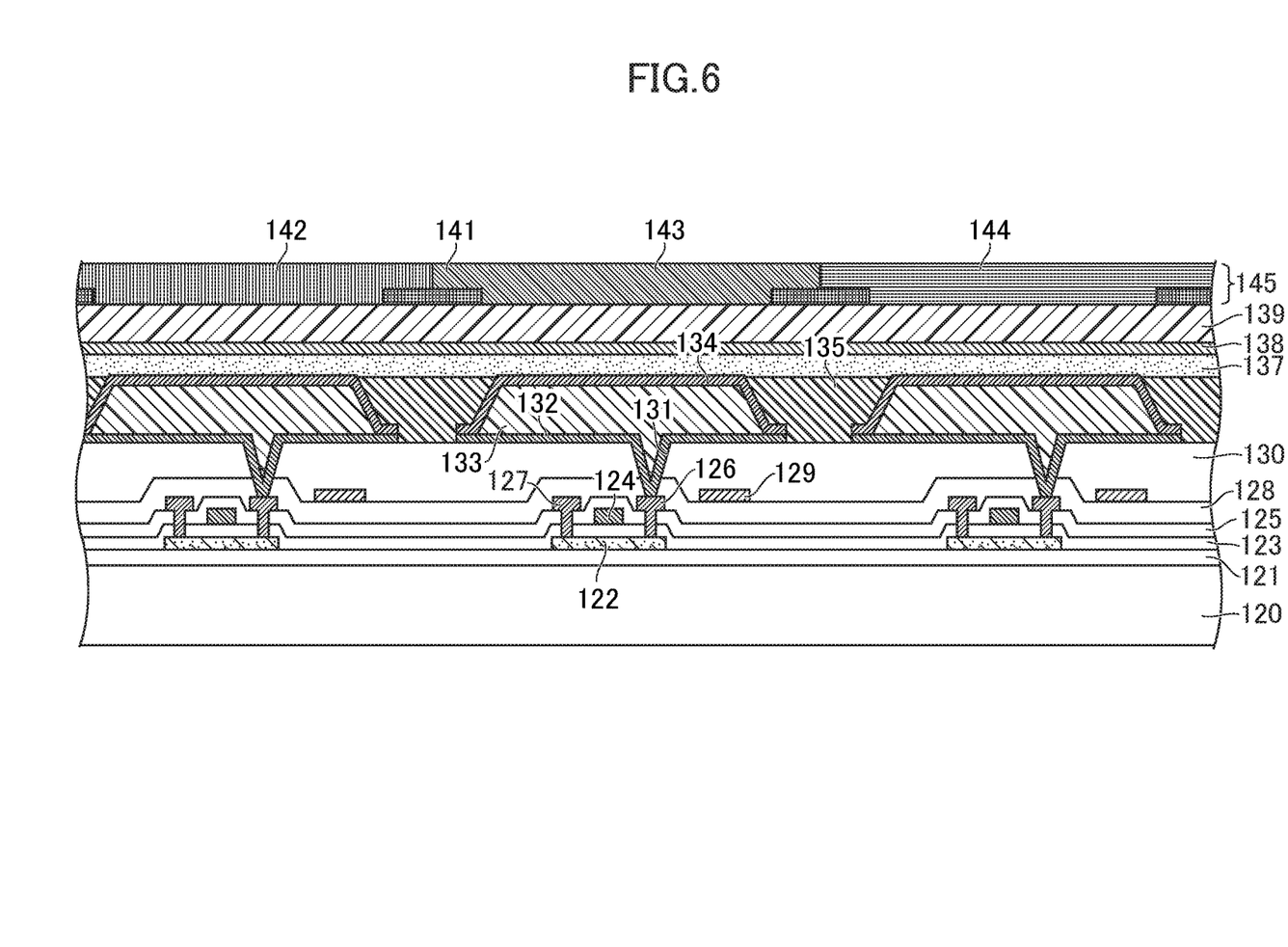
FIG. 6 is a partial cross-sectional view illustrating an example of the configuration of a pixel according to a fourth embodiment.

An organic EL display device according to a fourth embodiment is different in that the counter substrate 150 in the first embodiment is not present. The difference between the fourth embodiment and the first embodiment will be mainly described below.

FIG. 6 is a partial cross-sectional view illustrating an example of the configuration of the pixel 210 according to the fourth embodiment. In the organic EL display device according to the embodiment, the structures from the array substrate 120 to the sealing film 139 are similar to those of the first embodiment. On the other hand, the color filter 145 and the black matrix 141 are formed directly on the sealing film 139. The color filter 145 and the black matrix 141 are directly drawn on the sealing film 139 by, for example, inkjet. Since there is no layer of the filling material 140, a gap between the light-emitting region and the color filter 145 located above the light-emitting region is further narrowed, and thus the color mixture can be more suppressed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
  a plurality of pixels on a substrate including an insulating surface,
  each of the plurality of pixels including:
  a transistor above the insulating surface;
  a planarization film covering the transistor;
  a pixel electrode above the planarization film and electrically connected with the transistor;
  a bank layer above the planarization film and below the pixel electrode;
  an insulating layer in a recess located around the pixel electrode between the pixels adjacent to each other;
  a light-emitting layer covering a surface of the pixel electrode and at least a part of a surface of the insulating layer; and
  a counter electrode above the light-emitting layer, wherein
  the bank layer includes a top surface and a side surface,
  the pixel electrode covers the top surface and at least a part of the side surface of the bank layer,
  the recess is surrounded by the side surface of the bank layer, and
  a distance between a surface of the substrate and a face of the light-emitting layer in contact with the insulating layer is equal to or smaller than a distance between the surface of the substrate and a face of the light-emitting layer in contact with the pixel electrode.

2. The display device according to claim 1, wherein the pixel electrode has a shape, in a cross-sectional view, in which a central portion thereof is swelled relative to an edge portion thereof.

3. The display device according to claim 1, wherein the face of the light-emitting layer in contact with the pixel electrode overlaps the transistor in plan view.

4. The display device according to claim 1, wherein the light-emitting layer is on a plane spreading from the surface of the pixel electrode to the surface of the insulating layer.

5. The display device according to claim 1, wherein the light-emitting layer is formed such that a region overlapping the insulating layer is depressed beyond a region overlapping the pixel electrode.

6. The display device according to claim 1, wherein
the pixel electrode includes a top surface and a side surface, and
the recess is surrounded by the side surface of the pixel electrode.

7. The display device according to claim 1, wherein
the insulating layer has a light-shielding capability.

8. The display device according to claim 1, further comprising a counter substrate including a color filter layer corresponding to the plurality of pixels, wherein
the substrate and the counter substrate interpose the pixel electrode, the light-emitting layer and the counter electrode therebetween, and face each other via a filling material between the counter electrode and the counter substrate.

9. The display device according to claim 1, further comprising:
a sealing film above the counter electrode; and
a color filter above the sealing film and corresponding to the plurality of pixels.

10. A display device comprising:
a plurality of pixels on a substrate including an insulating surface,
each of the plurality of pixels including:
a transistor above the insulating surface;
a planarization film covering the transistor;
a pixel electrode above the planarization film and electrically connected with the transistor;
a bank layer above the planarization film and below the pixel electrode;
an insulating layer in a recess located around the pixel electrode between the pixels adjacent to each other;
a light-emitting layer covering a surface of the pixel electrode and at least a part of a surface of the insulating layer; and
a counter electrode above the light-emitting layer, wherein
the bank layer includes a top surface and a side surface,
the pixel electrode covers the top surface and at least a part of the side surface of the bank layer, and
the recess is surrounded by the side surface of the bank layer.

11. The display device according to claim 10, wherein
the pixel electrode has a shape, in a cross-sectional view, in which a central portion thereof is swelled relative to an edge portion thereof.

12. The display device according to claim 10, wherein
the face of the light-emitting layer in contact with the pixel electrode overlaps the transistor in plan view.

13. The display device according to claim 10, wherein
the light-emitting layer is on a plane spreading from the surface of the pixel electrode to the surface of the insulating layer.

14. The display device according to claim 10, wherein
the light-emitting layer is formed such that a region overlapping the insulating layer is depressed beyond a region overlapping the pixel electrode.

15. The display device according to claim 10, wherein the pixel electrode includes a top surface and a side surface, and the recess is surrounded by the side surface of the pixel electrode.

16. The display device according to claim 10, wherein
the insulating layer has a light-shielding capability.

17. The display device according to claim 10, further comprising a counter substrate including a color filter layer corresponding to the plurality of pixels, wherein
the substrate and the counter substrate interpose the pixel electrode, the light-emitting layer and the counter electrode therebetween, and face each other via a filling material between the counter electrode and the counter substrate.

18. The display device according to claim 10, further comprising:
a sealing film above the counter electrode; and
a color filter above the sealing film and corresponding to the plurality of pixels.

* * * * *